United States Patent
Dyer

(10) Patent No.: US 7,964,910 B2
(45) Date of Patent: Jun. 21, 2011

(54) PLANAR FIELD EFFECT TRANSISTOR STRUCTURE HAVING AN ANGLED CRYSTALLOGRAPHIC ETCH-DEFINED SOURCE/DRAIN RECESS AND A METHOD OF FORMING THE TRANSISTOR STRUCTURE

(75) Inventor: Thomas W. Dyer, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 282 days.

(21) Appl. No.: 11/873,731

(22) Filed: Oct. 17, 2007

(65) Prior Publication Data

US 2009/0101942 A1  Apr. 23, 2009

(51) Int. Cl.
*H01L 29/66* (2006.01)
(52) U.S. Cl. .......... 257/327; 257/19; 257/288; 257/368; 257/395; 257/396; 257/397; 257/622; 257/E21.549; 257/E29.255; 257/E29.277; 257/E29.279; 257/E29.02; 257/E29.023; 257/E29.021; 438/221; 438/222; 438/300
(58) Field of Classification Search .................. 257/19, 257/E21.549, E29.255, E29.277, E29.279, 257/327, 288, 622, 395, 396, 397, E29.02, 257/E29.023, E29.021, 368; 438/222, 221, 438/300
See application file for complete search history.

(56) References Cited

U.S. PATENT DOCUMENTS

| 6,737,716 | B1 | 5/2004 | Matsuo et al. | |
|---|---|---|---|---|
| 6,835,246 | B2 | 12/2004 | Zaidi | |
| 6,885,084 | B2 | 4/2005 | Murthy et al. | |
| 6,946,371 | B2 | 9/2005 | Langdo et al. | |
| 6,960,781 | B2 | 11/2005 | Currie et al. | |
| 2005/0156255 | A1* | 7/2005 | Yao et al. | 257/410 |
| 2005/0158937 | A1* | 7/2005 | Yang et al. | 438/199 |
| 2005/0285192 | A1 | 12/2005 | Zhu | |
| 2005/0285203 | A1* | 12/2005 | Fukutome et al. | 257/368 |
| 2006/0138398 | A1* | 6/2006 | Shimamune et al. | 257/19 |
| 2007/0238242 | A1* | 10/2007 | Ting et al. | 438/230 |
| 2008/0283906 | A1* | 11/2008 | Bohr | 257/327 |

* cited by examiner

*Primary Examiner* — Matthew E Warren
*Assistant Examiner* — David Z Chen
(74) *Attorney, Agent, or Firm* — Gibb I. P. Law Firm, LLC; Joseph Petrokaitis, Esq.

(57) ABSTRACT

Disclosed is a transistor that incorporates epitaxially deposited source/drain semiconductor films and a method for forming the transistor. A crystallographic etch is used to form recesses between a channel region and trench isolation regions in a silicon substrate. Each recess has a first side, having a first profile, adjacent to the channel region and a second side, having a second profile, adjacent to a trench isolation region. The crystallographic etch ensures that the second profile is angled so that all of the exposed recess surfaces comprise silicon. Thus, the recesses can be filled by epitaxial deposition without divot formation. Additional process steps can be used to ensure that the first side of the recess is formed with a different profile that enhances the desired stress in the channel region.

8 Claims, 16 Drawing Sheets

# PLANAR FIELD EFFECT TRANSISTOR STRUCTURE HAVING AN ANGLED CRYSTALLOGRAPHIC ETCH-DEFINED SOURCE/DRAIN RECESS AND A METHOD OF FORMING THE TRANSISTOR STRUCTURE

BACKGROUND

1. Field of the Invention

The embodiments of the invention generally relate to planar field effect transistors (FETs), and, more particularly, to a planar field effect transistor structure and method of forming the structure with epitaxially deposited source/drain regions.

2. Description of the Related Art

Charge carrier mobility affects current flowing through the channel region of field effect transistors. That is, in n-type field effect transistors (NFETS) current flow is proportional to the mobility of electrons in the channel region, whereas in p-type field effect transistors (PFETs) current flow is proportional to the mobility of holes in that channel region. Stress can be imposed upon on the channel region in order to adjust carrier mobility and, thereby, adjust current flow. Specifically, compressive stress on the channel region of a PFET can enhance hole mobility, whereas tensile stress on the channel region of an NFET can enhance electron mobility. Various stress engineering techniques are known for imparting the desired stress on NFET and PFET channel regions.

For example, as discussed in U.S. Pat. No. 6,885,084 of Murthy et al. issued on Apr. 26, 2005 and incorporated herein by reference, a compressive stress (i.e., a uni-axial compressive strain parallel to the direction of the current) can be created in the channel region of a PFET by forming the source/drain regions with an epitaxially deposited alloy of silicon and germanium. Unfortunately, when formed according to the technique described by Murphy et al., the resulting PFET structure is prone to junction leakage problems. Therefore, there is a need in the art for an improved transistor structure and method of forming the structure that incorporates epitaxially deposited source/drain semiconductor films.

SUMMARY

Disclosed herein are embodiments of an improved transistor structure that incorporates recesses in the semiconductor substrate that are filled with epitaxially deposited monocrystalline source/drain semiconductor films and a method of forming the transistor structure. Specifically, each source/drain recess has a first side adjacent to the channel region and a second side adjacent to a trench isolation region. A crystallographic etch process is used to form the source/drain recesses such that the profile of the second side of the recess is angled with only the edge at the top surface of the substrate abutting the trench isolation region. Consequently, all of the recess surfaces comprise exposed surfaces of the monocrystalline semiconductor substrate and the recesses can be filled by epitaxial deposition of a monocrystalline semiconductor film without divot formation.

In one embodiment, the first and second sides of the recess may be symmetric. However, in alternative embodiments, the first and second sides may be asymmetric. Specifically, epitaxially deposited source/drain semiconductor films are typically used to impart a desired stress on the channel region of the transistor in order to optimize charge carrier mobility and, thereby, to optimize current flow. However, the stress imparted on the channel region is a result, not only of the material used, but also its position relative to the channel region. That is, the profile of the first side of the recess adjacent to the channel region can be critical. Therefore, also disclosed herein are additional process steps that can be used to ensure that the first side of the recess is formed with a profile that enhances the desired stress in the channel region (e.g., a profile that is approximately normal relative to the top surface of the substrate or angled towards rather than away from the channel region).

More particularly, disclosed are embodiments of a planar field effect transistor (FET). Each of the FET embodiments can comprise a monocrystalline semiconductor substrate (e.g., a silicon substrate), a designated channel region within the substrate, a gate adjacent to the top surface of the substrate above the channel region and source/drain regions positioned on opposite sides of the channel region.

The FET can be isolated by trench isolation regions in the substrate such that each source/drain region is positioned between the channel region and a trench isolation region. These trench isolation regions can have sidewalls that are approximately normal relative to the top surface of the substrate. Additionally, rather than simply comprising doped portions of the substrate itself, the source/drain regions can comprise recesses in the substrate that are filled with an epitaxially deposited monocrystalline semiconductor fill material (e.g., epitaxial silicon germanium (eSiGe))

A unique aspect of this FET structure is the shape of the recesses in which the source/drain semiconductor film is epitaxially deposited. Specifically, each recess can comprise an edge at the top surface of the substrate, a bottom surface approximately parallel to the top surface of the substrate, a first side with a first profile adjacent to the channel region and a second side opposite the first side (i.e. adjacent to a trench isolation region) with a second profile. However, rather than the first and second profiles both being approximately normal relative to the top surface of the substrate, the second profile is angled.

More specifically, the second side of each recess is positioned adjacent to the sidewall of a trench isolation region such that an edge of the recess at the top surface of the substrate is in contact with the sidewall of the trench isolation region and, more particularly, such that this edge is in contact with the upper corner of the trench isolation region. From this edge, the second side of the recess is tapered (e.g., at an angle of approximately 55°) towards the bottom surface of the recess. Thus, the trench isolation region is separated from the source/drain region by a triangular portion of the substrate and all of the recess surfaces comprise exposed surfaces of the semiconductor substrate (e.g., exposed silicon surfaces). Since isolation material at the sidewall of the trench isolation region is not exposed within the recesses, the semiconductor film which is deposited epitaxially into each recess is not faceted along the sidewall of the trench isolation region.

In one embodiment of the transistor structure, the first and second sides of each recess may be symmetric (i.e., the first and second sides of each recess have the same angled profile). In alternative embodiments of the transistor structure, the first and second sides of each recess may be asymmetric. Specifically, alternative embodiments of the transistor structure are disclosed in which the first profile of the first side of each recess is different from the second profile of the second side of each recess and, more particularly, is tailored to enhance the desired stress to be imparted on the channel region. For example, for each recess, the first profile can be approximately normal relative to the top surface of the substrate (i.e., the first side can extend vertically from the edge of the recess to the bottom surface of the recess). Alternatively, the first profile can be angled in a rotated V-shape toward the channel region (i.e., the first side can have a first portion angled downward from the edge of the recess towards the channel region and a second portion angled upward from the bottom surface of the recess towards the channel region).

Also disclosed are embodiments of a method of forming the above-described planar field effect transistor (FET). The method embodiments comprise first providing a monocrystalline semiconductor substrate (e.g., a silicon substrate).

Next, trench isolation regions are formed in the substrate such that they have sidewalls that are approximately normal relative to the top surface of the substrate. After the trench isolation regions are formed, a gate is formed on the top surface of the substrate above a designated channel region between trench isolation regions. Once the gate is formed, gate sidewall spacers are formed on opposite sides of the gate.

Then, source/drain regions are formed in the substrate on opposite sides of the channel region and, more particularly, on opposite sides of the gate sidewall spacers between the channel region and the trench isolation regions. In order to form these source/drain regions, recesses are first formed in the substrate such that each recess has an edge at the top surface of the substrate, a bottom surface approximately parallel to the top surface of the substrate, a first side with a first profile adjacent the channel region and a second side with a second profile opposite the first side (i.e., adjacent to a trench isolation region). A unique aspect of this method is that the recesses are formed using one or more different etch processes to tailor the shape of each recess and, more particularly, to tailor the profiles of the first and second sides of each recess.

Specifically, one or more etch processes may be used to form the source/drain recesses and at least one of these etch processes is not directional. Rather it is used to tailor the shape of the recesses away from the conventional rectangular shape and, more specifically, to ensure that the second profile of the second side of each recess is angled relative to the top surface of the substrate (i.e., to ensure that the second profile is an angled profile).

For example, a crystallographic etch process can be used that etches a monocrystalline semiconductor material (e.g., a silicon substrate) with a first crystallographic orientation (e.g., a [100] crystallographic orientation) selective to a monocrystalline semiconductor material (e.g., a silicon substrate) with a second crystallographic orientation (e.g., a [111] crystallographic orientation) such that, after the crystallographic etch is performed, the sides of the recess are tapered (e.g., at an angle of approximately 55°) from the edge of the recess towards the bottom surface of the recess. The resulting profile of the second side of each recess is, thus, angled such that only an edge of the recess at the top surface of the substrate is in contact with the sidewall of the trench isolation region and, more particularly, such that only this edge is in contact with the upper corner of the trench isolation region. Thus, the crystallographic etch process ensures that each source/drain region is separated from its adjacent trench isolation region by a triangular portion of the substrate and, thereby, ensures that all of the recess surfaces comprise exposed surfaces of the substrate.

If only a crystallographic etch process is used to form the recess, then the first and second sides of the recess will be symmetric (i.e., will be formed with the same angled profile). However, in alternative embodiments of the method, additional process steps can be employed so that the first and second sides of each recess will be asymmetrical (i.e., will be formed with different profiles). Specifically, as discussed above, epitaxially deposited source/drain semiconductor films are typically used to impart a desired stress on the FET channel region in order to optimize charge carrier mobility and, thereby, current flow. However, the stress imparted on the channel region is a result, not only of the material used, but also its position relative to the channel region (i.e., the first profile of the first side of each recess adjacent to the channel region can be critical). Consequently, in addition to the crystallographic etch, additional process steps, including but not limited to an additional etch process, may be used during recess formation to tailor the first profile of the first side of each recess in order to enhance the desired stress imparted on the channel region.

For example, before the crystallographic etch is performed, an ion implantation process can be performed in order to form either doped or amorphized portions of the substrate immediately adjacent to the channel region. Then, after the crystallographic etch, the doped/amorphized portions of the substrate can be selectively etched such that the resulting first side of each recess extends vertically from the upper edge of the recess to the bottom surface of the recess (i.e., such that the first profile of the first side of each recess is approximately normal relative to the top surface of the substrate).

Alternatively, after the ion implantation process, but before the crystallographic etch, the doped or amorphized portions of the substrate can be selectively etched. Consequently, after the crystallographic etch is performed, the first side of each recess will have a first portion angled downward from the upper edge of the recess towards the channel region and a second portion angled upward from the bottom surface of the recess towards the channel region (i.e., the first profile of the first side of each recess will be angled in a V-shape toward the channel region).

After the recesses are formed, they can be filled with a monocrystalline semiconductor film using conventional epitaxial deposition processes. For example, if the transistor being formed is a p-type field effect transistor (PFET), then silicon germanium can be deposited epitaxially into the recesses in order to impart a compressive stress on the channel region. Since the recess surfaces comprise exposed surfaces of the semiconductor substrate (e.g., exposed silicon substrate) only, the epitaxial semiconductor film that is deposited will completely fill each recess. That is, the epitaxial semiconductor film deposition will not be faceted and, thus, no divots will be formed in the recesses along the sidewalls of the trench isolation regions.

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of the embodiments of the invention without departing from the spirit thereof, and the embodiments of the invention include all such changes and modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
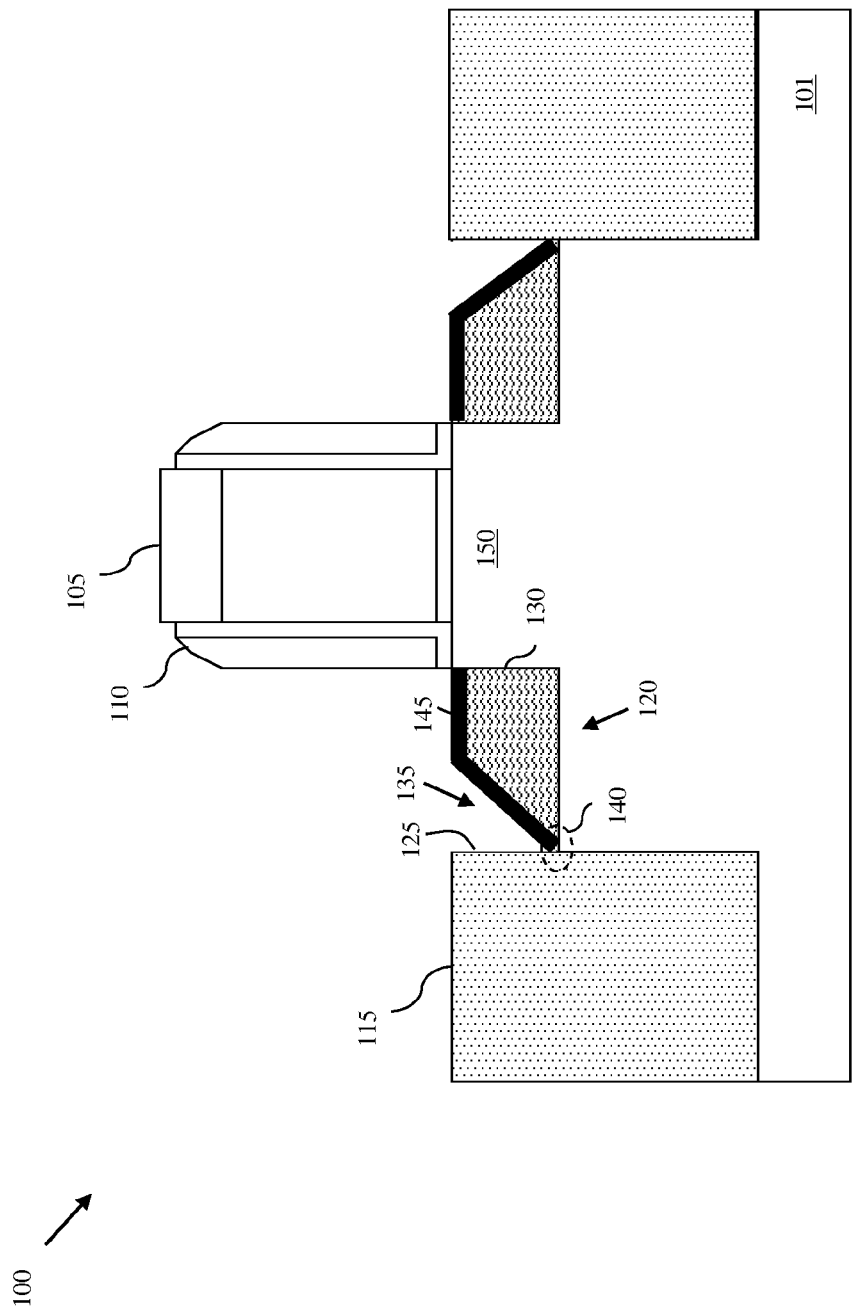
FIG. 1 is a cross-section diagram illustrating a field effect transistor.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, charge carrier mobility affects current flowing through the channel region of field effect transistors. That is, in n-type field effect transistors (NFETS) current flow is proportional to the mobility of electrons in the channel region, whereas in p-type field effect transistors (PFETs) current flow is proportional to the mobility of holes in that channel region. Stress can be imposed upon on the channel region in order to adjust carrier mobility and, thereby, adjust current flow. Specifically, compressive stress on the channel region of a PFET can enhance hole mobility, whereas tensile stress on the channel region of an NFET can enhance electron mobility. Various stress engineering techniques are known for imparting the desired stress on NFET and PFET channel regions.

Figure 5:
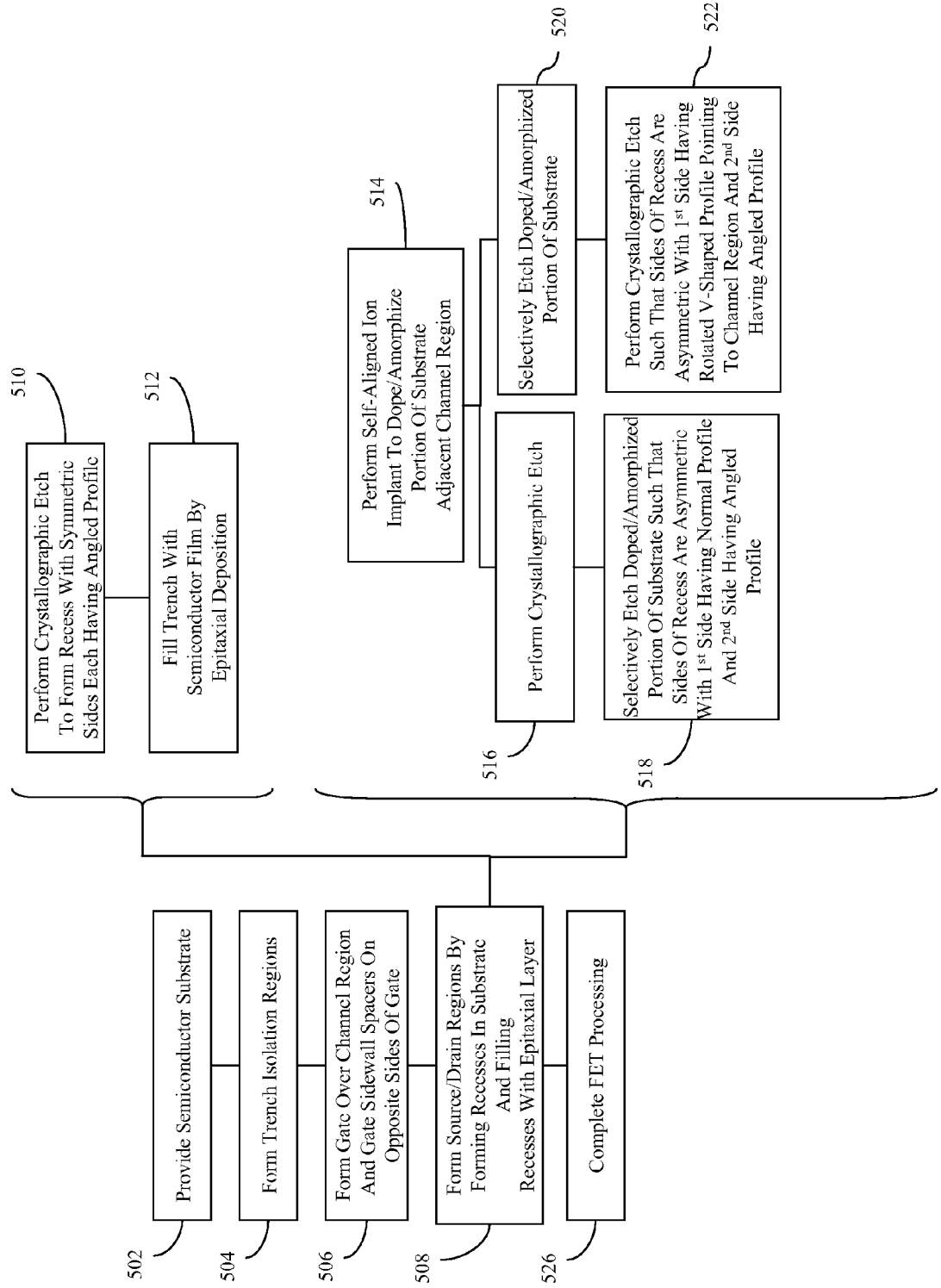
FIG. 5 is a flow diagram illustrating method embodiments for forming the field effect transistors of FIGS. 2-4.
Figure 6:
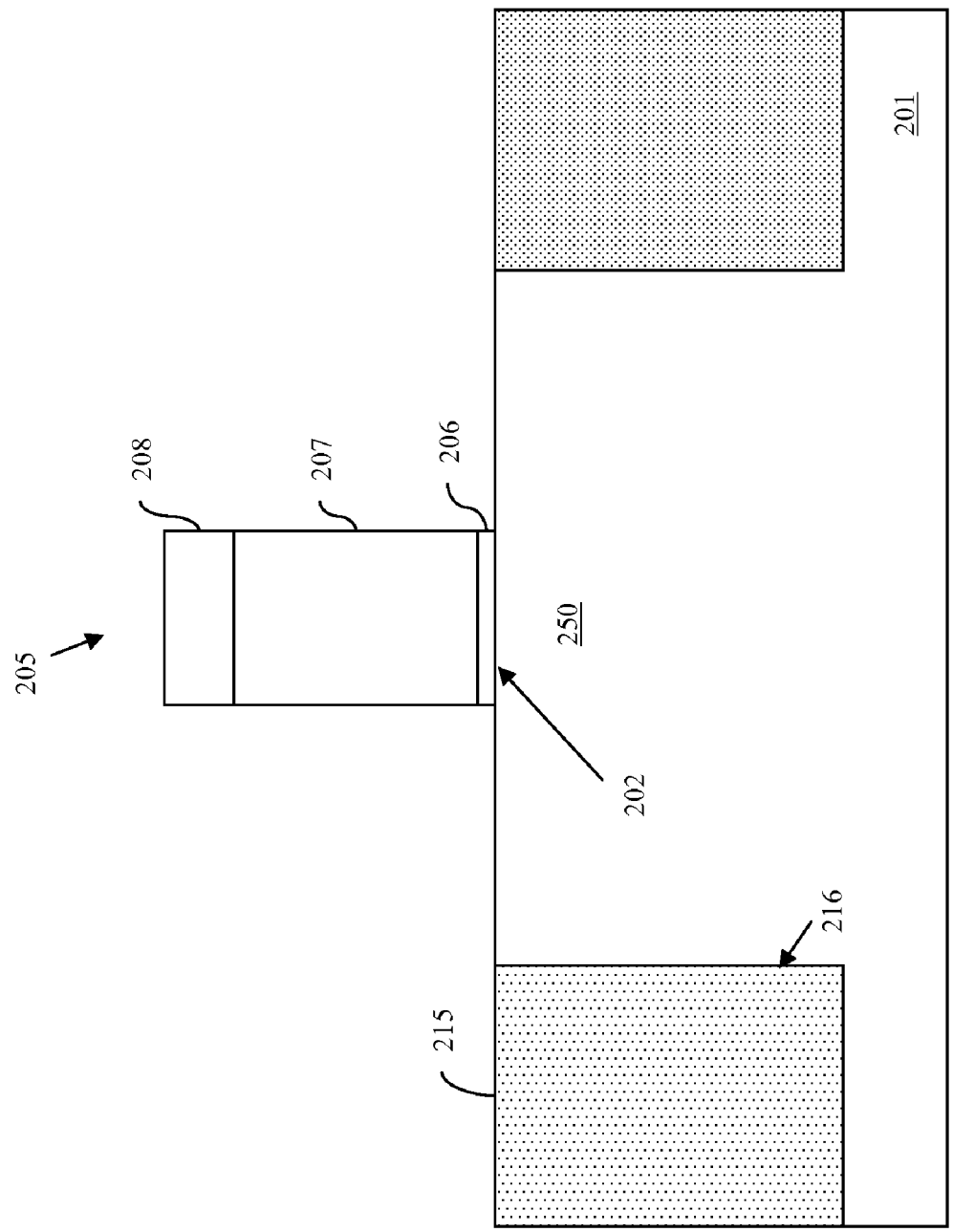
FIG. 6 is a cross-section diagram illustrating a partially-completed field effect transistor.

For example, as discussed in U.S. Pat. No. 6,885,084 of Murthy et al. issued on Apr. 26, 2005 and incorporated herein by reference, a compressive stress (i.e., a uni-axial compressive strain parallel to the direction of the current) can be created in the channel region of a PFET by forming the source/drain regions with an epitaxially grown alloy of silicon and germanium. Unfortunately, PFETs formed according to the technique described by Murphy et al. are prone to current leakage problems. Specifically, as illustrated in FIG. 5 of Murphy et al. and discussed in the related text, when forming such a PFET an anisotropic etch process (i.e., a directional etch process) is used to form recesses 36A-B between the channel region 30 and each of the isolation regions 30. Then, as illustrated in FIG. 6 and discussed in the related text, silicon germanium (SiGe) source and drain films 40A-B are epitaxially formed in the recesses 36A-B. However, the Applicants have found that contrary to the what is shown in FIG. 6 of Murphy et al., the described technique would not result in the recesses 36A-B being completely filled with the SiGe source and drain films 40A-B.

More specifically, the Applicants submit that FIG. 1 of the present application is a more accurate illustration of the resulting PFET structure 100 formed using prior art formation techniques, such as those described in Murphy et al. That is, to form the PFET structure 100 of FIG. 1 isolation regions 115 are formed in a silicon substrate 101. A gate structure 105 is formed above a designated channel region 150 in the substrate 101 between the isolation regions 115. Sidewall spacers 110 are formed on opposite sides of the gate 105. Then, an anisotropic etch process (i.e., a directional etch process) is used to form recesses 120 aligned between the sidewall spacer 110 and isolation regions 115. Due to this anisotropic etch process, each recess 120 has a first side adjacent to the channel region 150 such that it comprises silicon, a bottom surface adjacent to the substrate 101 such that it comprises silicon and a second side adjacent to one of the isolation regions 115 such that it comprises an isolation material (i.e., the second side of each recess 120 comprises an exposed surface 125 of an isolation region 115). An epitaxial deposition process is then used to form silicon germanium (SiGe) source and drain films 130 in each recess 120. However, because the second side of the recess 120 comprises an isolation material rather than silicon, silicon germanium does not grow epitaxially from the second side of the recess 120 and silicon germanium deposition is faceted. Due to this facetted deposition, a triangular shaped divot 135 is present that extends along the exposed isolation trench surface 125 to the bottom corner 140 of the recess 120. For example, if the depth of the trench is 125.2 nm, silicon germanium will grow epitaxially at a 54.83° angle from the bottom corner 140 of the recess 120 adjacent to the exposed isolation trench surface 125. A silicide 145 is then formed on the exposed SiGe 130. Unfortunately, the resulting PFET structure 100 exhibits a serious junction leakage problem because the divot 135 allows silicide 145 to form at the bottom corner 140 of the recess 120 adjacent to the silicon substrate 101.

In view of the foregoing, disclosed herein are embodiments of an improved transistor structure that incorporates recesses in the semiconductor substrate that are filled with epitaxially deposited source/drain semiconductor films and a method of forming the transistor structure. Specifically, each source/drain recess has a first side adjacent to the channel region and a second side adjacent to a trench isolation region. A crystallographic etch process is used to form the source/drain recesses such that the profile of the second side of the recess is angled with only the edge at the top surface of the substrate abutting the trench isolation region. Consequently, all of the recess surfaces comprise exposed surfaces of the semiconductor substrate and the recesses can be filled by epitaxial deposition of a semiconductor film without divot formation (i.e., the epitaxial deposition of the semiconductor film will not be faceted).

In one embodiment, the first and second sides of the recess may be symmetric (i.e., both sides may have the same angled profile, due to the crystallographic etch). However, in alternative embodiments, the first and second sides may be asymmetric. Specifically, epitaxially deposited source/drain semiconductor films are typically used to impart a desired stress on the channel region of the transistor in order to optimize charge carrier mobility and, thereby, to optimize current flow. However, the stress imparted on the channel region is a result, not only of the material used, but also its position relative to the channel region. That is, the profile of the first side of the recess adjacent to the channel region can be critical. Therefore, also disclosed herein are additional process steps that can be used to ensure that the first side of the recess is formed with a profile that enhances the desired stress in the channel region (e.g., a profile that is approximately normal (e.g. perpendicular or at a right angle) relative to the top surface of the substrate or angled towards rather than away from the channel region).

Figure 2:
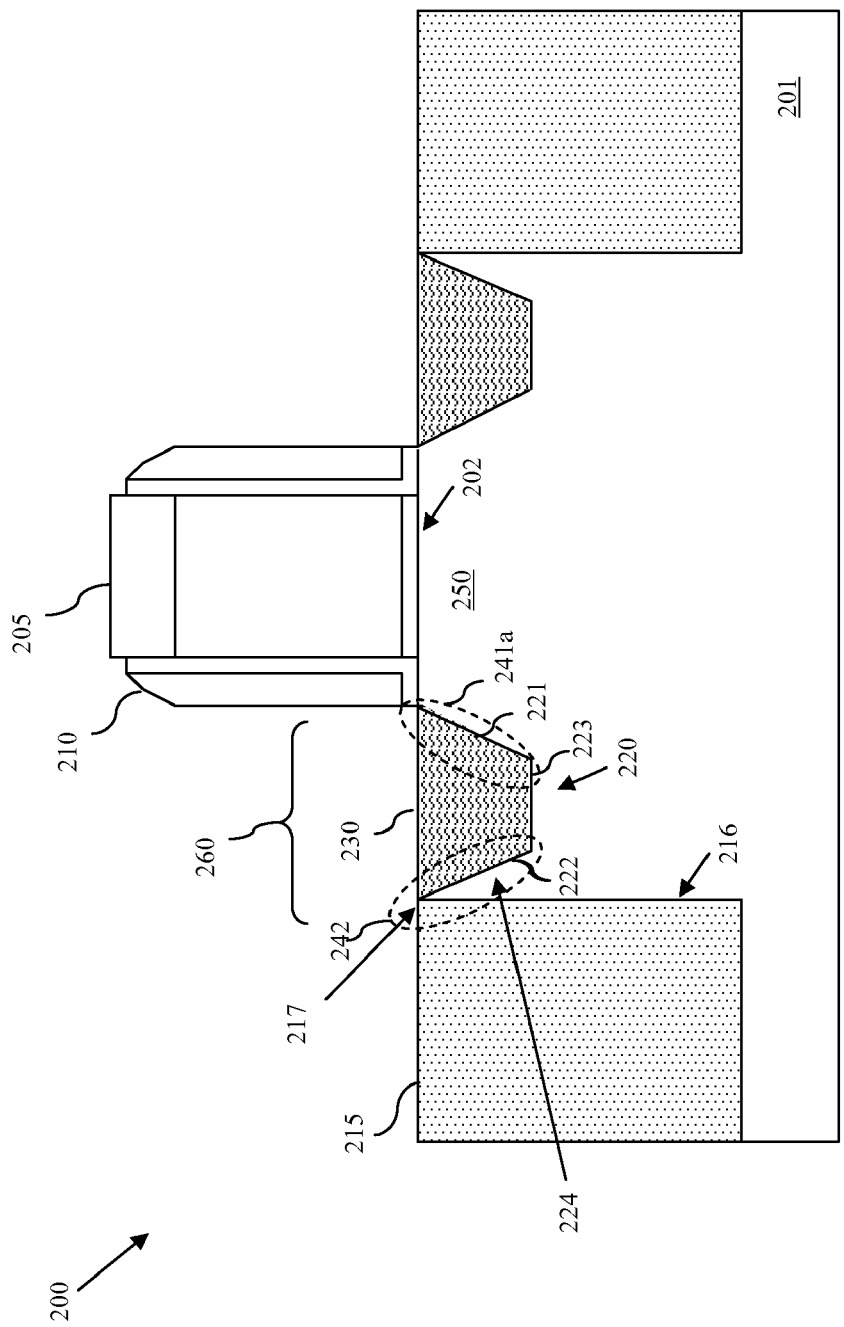
FIG. 2 is a cross-section diagram illustrating an embodiment of a field effect transistor of the present invention.
Figure 3:
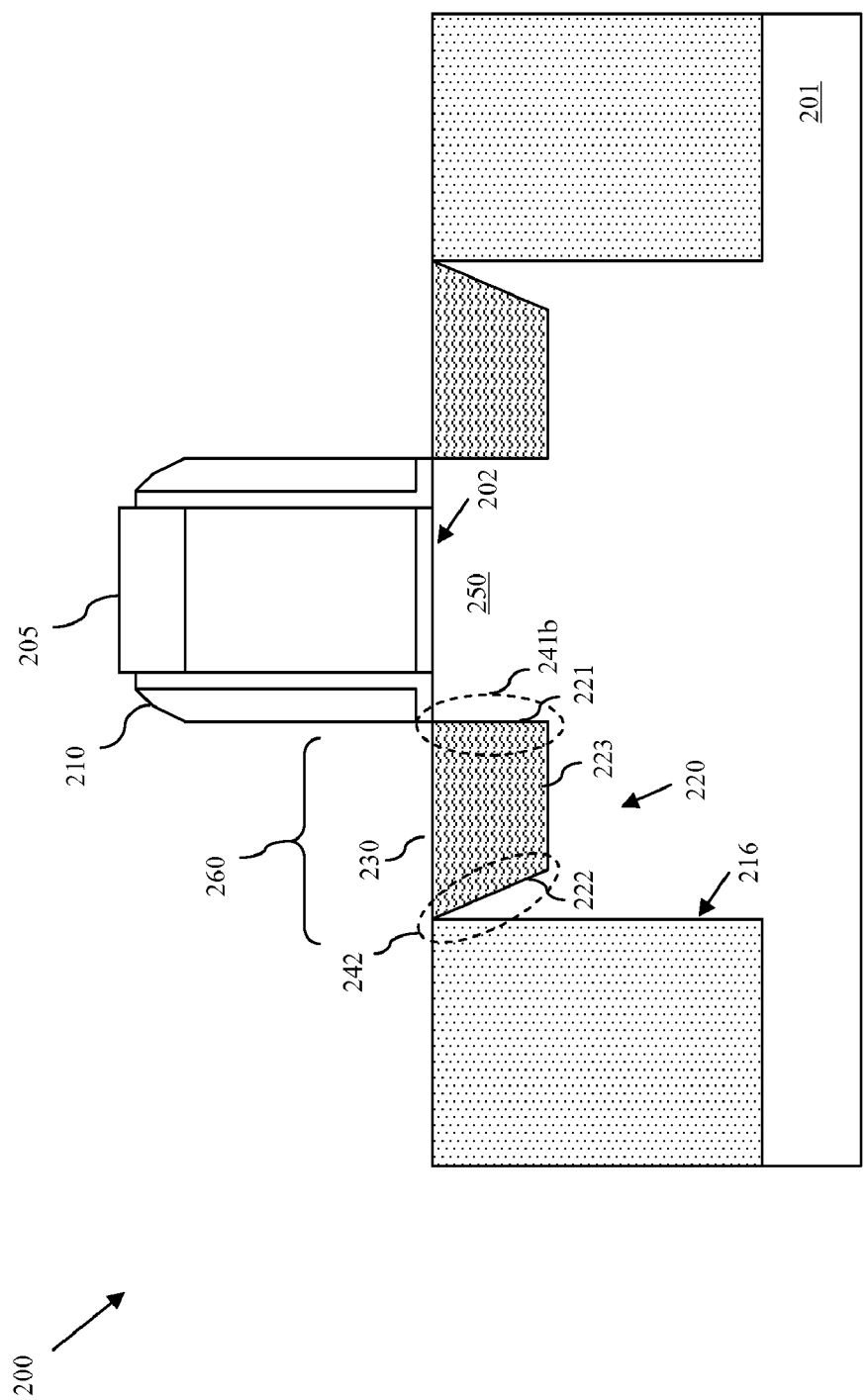
FIG. 3 is a cross-section diagram illustrating another embodiment of a field effect transistor of the present invention.
Figure 4:
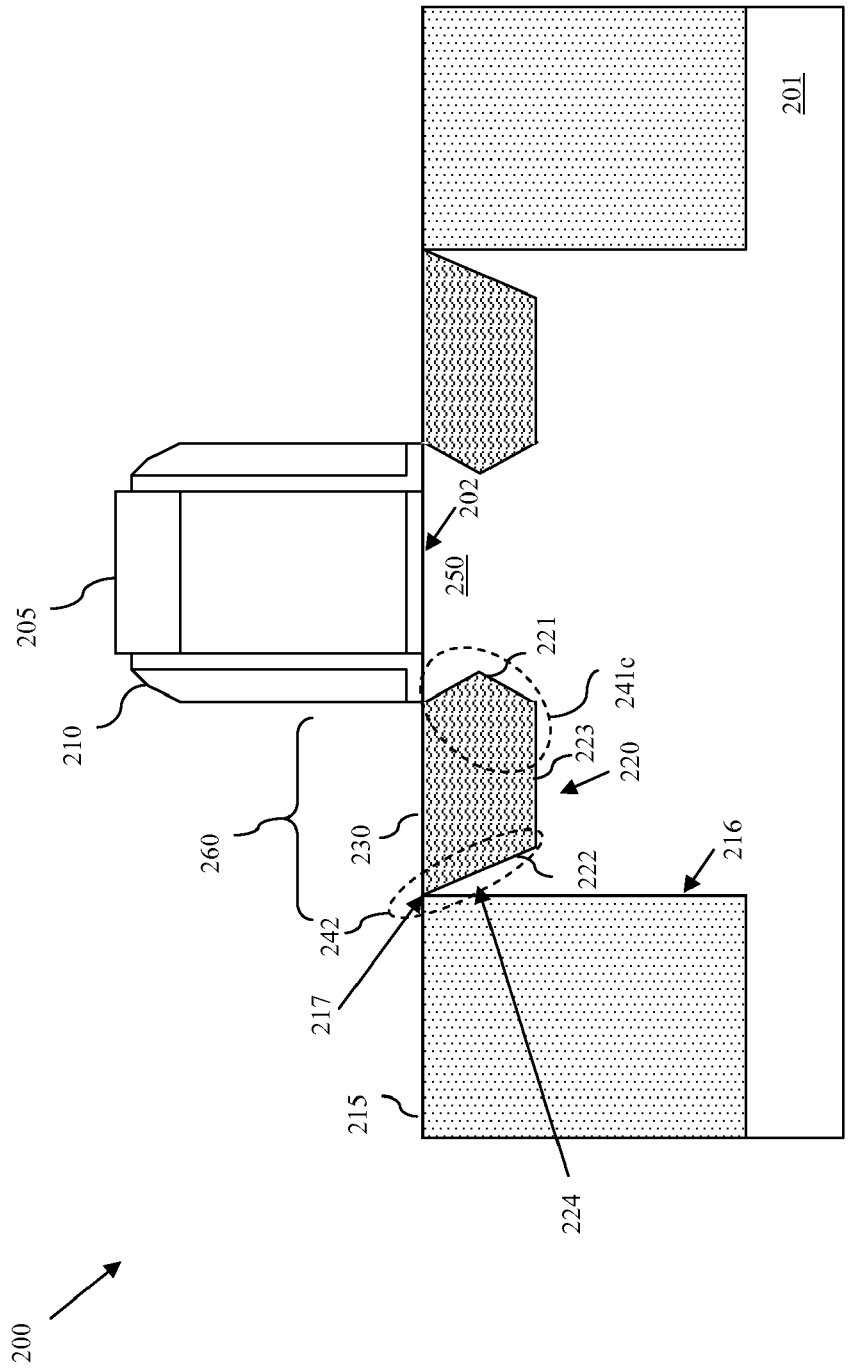
FIG. 4 is a cross-section diagram illustrating yet another embodiment of a field effect transistor of the present invention.

More particularly, referring to FIGS. 2-4, disclosed are embodiments of a planar field effect transistor (FET) 200. Each of the FET 200 embodiments can comprise a monocrystalline semiconductor substrate 201 (e.g., a bulk silicon substrate, a silicon-on-insulator (SOI) substrate, a monocrystalline epitaxial semiconductor layer on a monocrystalline semiconductor wafer, etc.). The substrate 201 can be appropriately doped depending upon whether the FET 200 is an n-type field effect transistor (NFET) or p-type field effect transistor (PFET). For example, if the FET 200 comprises an NFET, the substrate 201 or a portion therefore (e.g., a PWELL) can be lightly doped with a p-type dopant (e.g., boron (B)). Alternatively, if the FET 200 comprises a PFET, the substrate 201 or a portion therefore (e.g., an NWELL) can be lightly doped with an n-type dopant (e.g., phosphorous (B), arsenic (As) or antimony (Sb)).

A gate 205 (i.e., a gate dielectric-gate polysilicon stack) can be positioned adjacent to the top surface 202 of the substrate 201 above a designated channel region 250. Gate sidewall spacers 210 comprising, for example, a nitride can be positioned on opposite sides of the gate 205.

Source/drain regions 260 can be positioned on opposite sides of the channel region 250 aligned with the outside surface of the gate sidewall spacers 210. The source/drain regions 260 can be appropriately doped, depending upon whether the FET 200 is an NFET or PFET. For example, if the FET 200 comprises an NFET, the source/drain regions can be heavily doped with an n-type dopant (e.g., phosphorous (B), arsenic (As) or antimony (Sb)). Alternatively, if the FET 200 comprises a PFET, the source/drain regions can be heavily doped with a p-type dopant (e.g., boron (B)).

The FET 200 can further be isolated by trench isolation regions 215 in the substrate 201 such that each source/drain region 260 is positioned between the channel region 250 and a trench isolation region 215. These trench isolation regions 215 can comprise conventional oxide-filled shallow and/or deep trench isolation regions (STIs or DTIs) with sidewalls 216 that are approximately normal (i.e., perpendicular) relative to the top surface 202 of the substrate 201. Additionally, rather than simply comprising appropriately doped portions of the substrate 201 itself, the source/drain regions 260 comprise recesses 220 in the substrate 201 that are filled with an epitaxially deposited semiconductor film 230. For example, if the FET 200 comprises a PFET, the semiconductor film 230 can comprise epitaxial silicon germanium (eSiGe) for imparting a compressive stress on the channel region 250 in order to enhance hole mobility.

An aspect of this FET 200 structure is the shape of the source/drain regions 260 and, more particularly, the shape of the recesses 220 in which a source/drain semiconductor film 230 is epitaxially deposited. Specifically, each source/drain region 260 can comprise a recess 220 filled with an epitaxially deposited monocrystalline semiconductor film 230. Each recess 220 can comprise an edge at the top surface 202 of the substrate 201 and a bottom surface 223 approximately parallel to the top surface 202 of the substrate 201. Each recess can also comprise a first side 221 with a first profile (see first profile 241a of FIG. 2, first profile 241b of FIG. 3 and first profile 241c of FIG. 4) adjacent to the channel region as well as a second side 222 opposite the first side 221 (i.e. adjacent to a trench isolation region 215) with a second profile 242. Specifically, the first side 221 of the recess 220 is aligned with the outer surface of the gate sidewall spacers 210 and the second side 222 of the recess 220 is aligned with a trench isolation region 215. However, rather than the first and second profiles (241a-c and 242, respectively) of the first and second sides 221-222 both being approximately normal relative to the top surface 202 of the substrate 201, the second profile 242 is angled (i.e., the second side 222 of the recess 220 has an angled profile).

More specifically, the second side 222 of each recess 220 is positioned adjacent to the sidewall 216 of a trench isolation region 215 such that an edge of the recess 220 at the top surface 202 of the substrate 201 is in contact with (i.e., abuts) the sidewall 216 of the trench isolation region 215 and, more particularly, such that this edge is in contact with (i.e., abuts) the upper corner 217 of the trench isolation region 215. From this recess edge at the upper corner 217 of the trench isolation region 215, the second side 222 of the recess 220 is tapered (e.g., at an angle of approximately 55° and, more particularly, at an angle of 54.83°) towards the bottom surface 223 of the recess 220. Since the sidewall 216 of the trench isolation region 215 is approximately normal (i.e., perpendicular) relative to the top surface 202 of the substrate 201 and since the profile 242 of the second side 222 of the recess 220 is angled, the trench isolation region 215 is separated from the source/drain region 260 by a triangular portion 224 of the substrate 201. Furthermore, all of the recess surfaces 221-223 comprise exposed surfaces of the monocrystalline semiconductor substrate 201 (e.g., exposed silicon surfaces). Thus, the recess 220 can be completely filled by an epitaxially deposited monocrystalline semiconductor film 230 without the formation of divots. That is, since isolation material at the sidewall 216 of the trench isolation region 215 is not exposed within the recesses 220, the moncrystalline semiconductor film 230 which is deposited epitaxially into each recess 220 is not faceted along the sidewall 216 of the trench isolation region 215.

Referring specifically to FIG. 2, in one embodiment of the transistor 200 structure, the first and second sides (221 and 222, respectively) of each recess 220 may be symmetric. Specifically, if only a crystallographic etch process (discussed in detail below) is used to form the source/drain recesses 220; the first and second sides 221, 222 of each recess 220 will have the same angled profiles 241a and 242.

Alternative embodiments of the transistor 200 structure, the first and second sides 221-222 of each recess 220 may be asymmetric. Specifically, epitaxially deposited source/drain semiconductor films 230 are typically used to impart a desired stress on the channel region 250 in order to optimize charge carrier mobility and, thereby, current flow. For example, epitaxially deposited silicon germanium (eSiGe) can be used to impart compressive stress on the channel region 250 of a p-type field effect transistor (PFET) in order to enhance hole mobility. However, the stress imparted on the channel region 250 is a result, not only of the material 230 used, but also its position relative to the channel region 250 (i.e., the first profile of the first side 221 of the recess 220 adjacent to the channel region 250 can be critical). If, as in FIG. 2, the first profile 241a is angled away from the channel region 250, the amount of stress imparted by the epitaxially deposited source/drain semiconductor film 230 is limited.

Thus, alternative embodiments of the transistor structure are illustrated in FIGS. 3 and 4, where the first profile (see 241b of FIGS. 3 and 241c of FIG. 4) of the first side 221 of each recess 220 is different from the second profile 242 of the second side 222 of each recess 220. More particularly, the first profiles 241b-c in FIGS. 3-4 are tailored to enhance the desired stress imparted on the channel region 250. For example, as illustrated in FIG. 3, for each recess 220, the first profile 241b can be approximately normal relative to the top surface 202 of the substrate 201 (i.e., the first side 221 can extend vertically from the edge of the recess 220 to the bottom surface 223 of the recess 220). Alternatively, as illustrated in FIG. 4, the first profile 241c can be angled in a V-shape toward the channel region 250 (i.e., the first side 221 can have a first portion angled downward from the edge of the recess towards the channel region 250 and a second portion angled upward from the bottom surface 223 of the recess 220 towards the channel region 250).

Other features of the FET 200 can include, but are not limited to, source/drain extension regions below the gate sidewall spacers 210, halo regions between the source/drain regions 260 and the channel region 250, silicides above the source/drain regions 260 and gate polysilicon, etc.

Referring to FIG. 5, also disclosed are embodiments of a method of forming the above-described planar field effect transistor (FET) 200. The method embodiments comprise first providing a monocrystalline semiconductor substrate 201 (e.g., bulk silicon substrate, a silicon-on-insulator (SOI) substrate, a monocrystalline epitaxial semiconductor layer on a monocrystalline semiconductor wafer, etc.) (502, see FIG. 6). The substrate 201 can be appropriately doped depending upon whether the FET 200 is an n-type field effect transistor (NFET) or p-type field effect transistor (PFET). For example, if the FET 200 comprises an NFET, the substrate 201 or a portion therefore (e.g., a PWELL) can be lightly doped with a p-type dopant (e.g., boron (B)). Alternatively, if the FET 200 comprises a PFET, the substrate 201 or a portion therefore (e.g., an NWELL) can be lightly doped with an n-type dopant (e.g., phosphorous (B), arsenic (As) or antimony (Sb)).

Next, conventional processing techniques are used to form trench isolation regions 215 (e.g., shallow trench isolation regions (STIs) and/or deep trench isolation regions (DTIs) in the substrate 201 such that each trench isolation region 215 has sidewalls 216 that are approximately normal relative to the top surface 202 of the substrate 201 (504, see FIG. 6).

Figure 7:
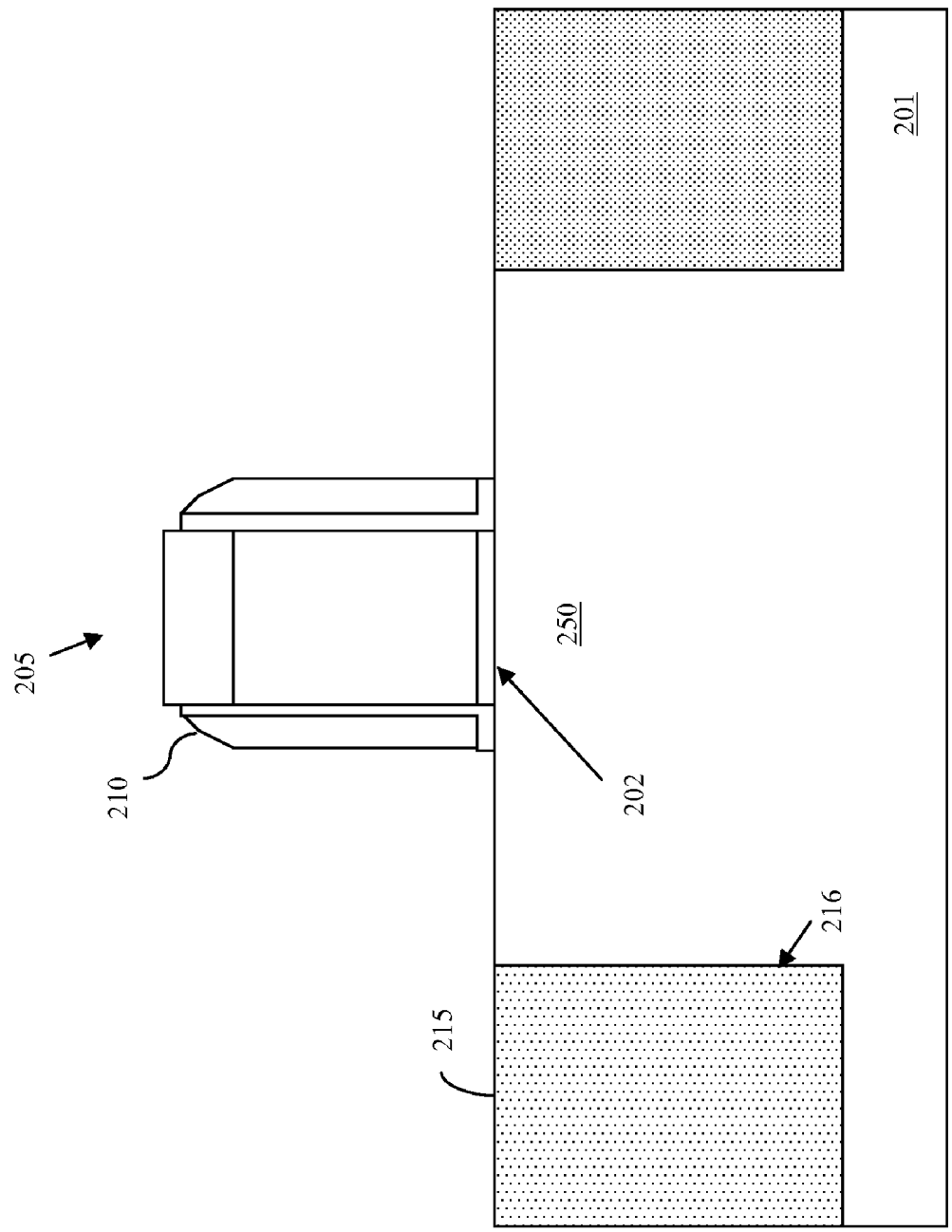
FIG. 7 is a cross-section diagram illustrating a partially-completed field effect transistor.

After the trench isolation regions 215 are formed, conventional processing techniques are used to form a gate 205 on the top surface 202 of the substrate 201 above a designated channel region 250 between trench isolation regions 215 (506, see FIG. 6). For example, a gate stack comprising a gate dielectric layer 206, gate polysilicon layer and etch stop layer 208 can be lithographically patterned and etched to form the gate 205. Once the gate 205 is formed, sidewall spacers 210 (e.g., nitride spacers) are formed on opposite sides of the gate 205 (see FIG. 7).

Then, source/drain regions 260 are formed in the substrate 201 on opposite sides of the channel region 250 and, more particularly, on opposite sides of the gate sidewall spacers 210 between the channel region 250 and the trench isolation regions 215 (508, see completed FET 200 of FIGS. 2-4). In order to form these source/drain regions 260, recesses 220 are first formed in the substrate 201 such that each recess 220 has: an edge at the top surface 202 of the substrate; 201 a bottom surface 223 approximately parallel to the top surface 202 of the substrate 201; a first side 221 with a first profile adjacent the channel region 250 and, more particularly, aligned with the outer edge of the gate sidewall spacers 210; and a second side 222 with a second profile opposite the first side 221 (i.e., adjacent to and aligned with a trench isolation region 215). The recesses 220 are then filled by epitaxial deposition of a monocrystalline semiconductor layer 230.

A unique aspect of this method is that the recesses 220 are formed using one or more different etch processes to tailor the shape of each recess 220 and, more particularly, to tailor the profiles of the first and second sides 221-222 of each recess 220. Specifically, one or more etch processes may be used to form the source/drain recesses 220 and at least one of these etch processes is not directional. Rather it is used to tailor the shape of the recesses 220 away from the conventional rectangular shape and, more specifically, to ensure that the second profile 242 of the second side 222 of each recess 220 is angled relative to the top surface 202 of the substrate 201 (i.e., to ensure that the second profile 242 is an angled profile).

For example, a crystallographic etch process can be used that etches a monocrystalline semiconductor material (e.g., a silicon substrate) with a first crystallographic orientation (e.g., a [100] crystallographic orientation) selective to a monocrystalline semiconductor material (e.g., a silicon substrate) with a second crystallographic orientation (e.g., a [111] crystallographic orientation) such that, after the crystallographic etch is performed, the sides of the recess are tapered (e.g., at an angle of approximately 55° and, more particularly, at an angle of 54.83° or any other appropriate angle) from the edge of the recess towards the bottom surface of the recess. Typical crystallographic etchants include hydroxide solutions such as ammonium-hydroxide (NH4OH) and potassium-hydroxide (KOH). Crystallographic selectivities that are greater than 200:1 for etching [100] selective to [111] can be achieved at temperatures of about 100° C.

The resulting profile 242 of the second side 222 of each recess 220 is, thus, angled such that only an edge of the recess 220 at the top surface 202 of the substrate 202 is in contact with (i.e., abuts) the sidewall 216 of the trench isolation region 215 and, more particularly, such that only this edge is in contact with (i.e., abuts) the upper corner 217 of the trench isolation region 215. Since the sidewalls 216 of each trench isolation region 215 are approximately normal relative to the top surface 202 of the substrate 201 and since the profile 242 of the second side 222 of each recess 220 is angled, the crystallographic etch process ensures that each source/drain region 260 is separated from its adjacent trench isolation region 215 by a triangular portion 224 of the substrate 201 and, thereby, ensures that all of the recess surfaces comprise exposed surfaces of the monocrystalline semiconductor substrate (e.g., silicon substrate).

Figure 8:
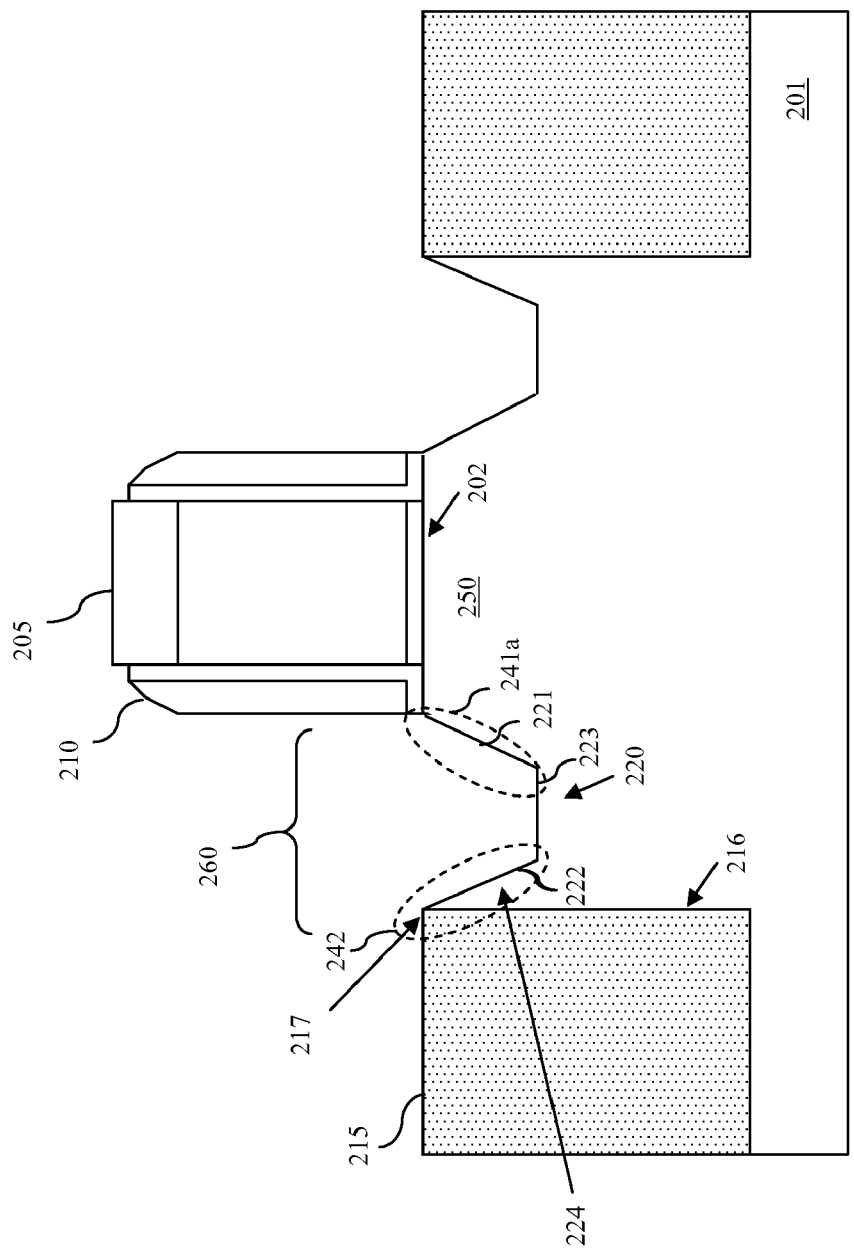
FIG. 8 is a cross-section diagram illustrating a partially-completed field effect transistor.

If only a crystallographic etch process is used to form the recess 220, then the first and second sides 221-222 of the recess 220 will be symmetric (i.e., the first and second profiles 241a and 242 will be formed with the same angled profile) (510, see FIG. 8). However, in alternative embodiments of the method, additional process steps, including but not limited to at least one additional etch process, can be employed so that the first and second sides 221-222 of each recess 220 are asymmetrical.

Specifically, as discussed above, epitaxially deposited source/drain semiconductor films are typically used to impart a desired stress on the FET channel region in order to optimize charge carrier mobility and, thereby, current flow. For example, epitaxially deposited silicon germanium (eSiGe) can be used to impart compressive stress on the channel region of a p-type field effect transistor (PFET) in order to enhance hole mobility. However, the stress imparted on the channel region is a result, not only of the material used, but also its position relative to the channel region (i.e., the first profile of the first side of each recess adjacent to the channel region can be critical). If the first profile is angled away from the channel region, the amount of stress imparted by the epitaxially deposited source/drain semiconductor films is limited.

Figure 9:
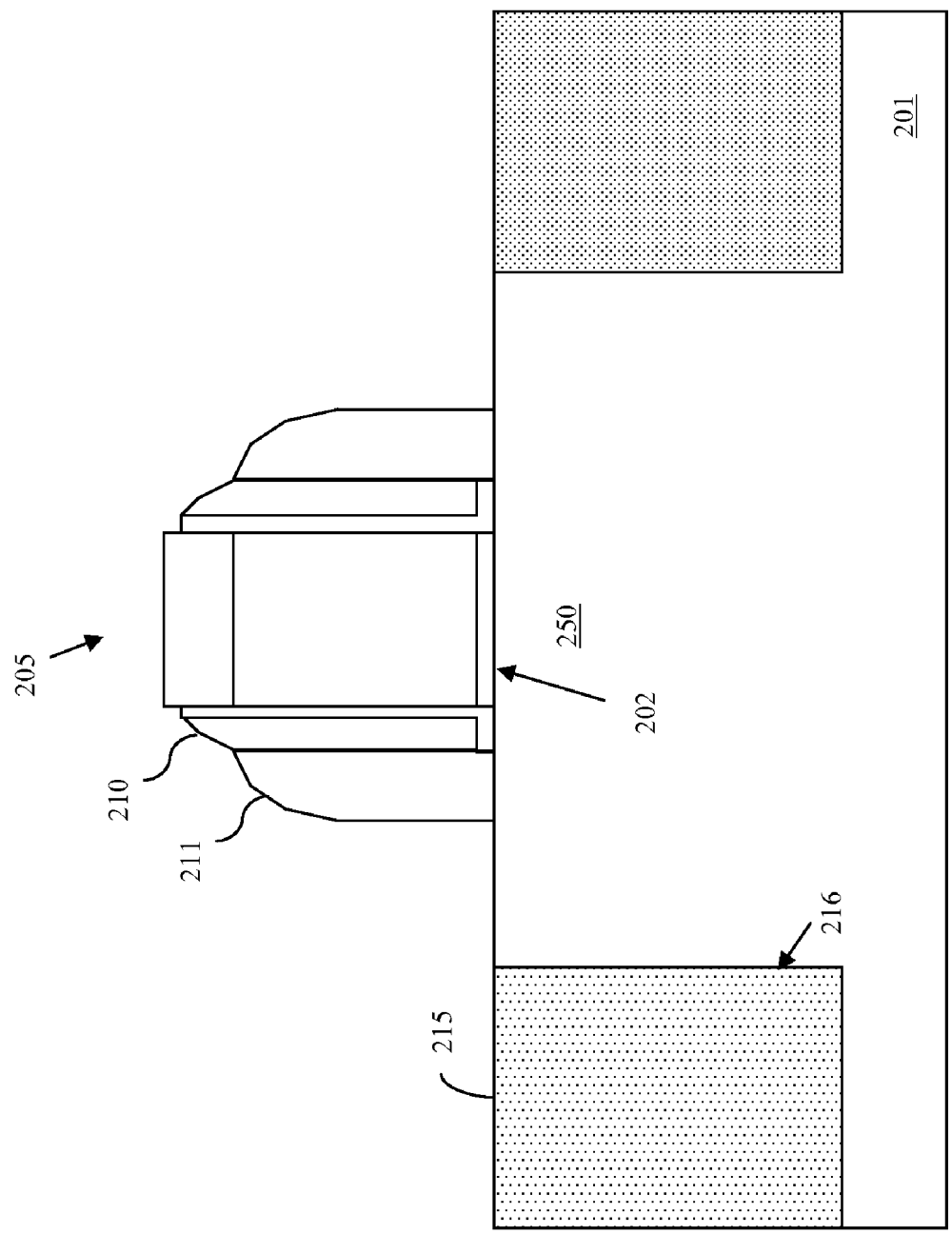
FIG. 9 is a cross-section diagram illustrating a partially-completed field effect transistor.
Figure 10:
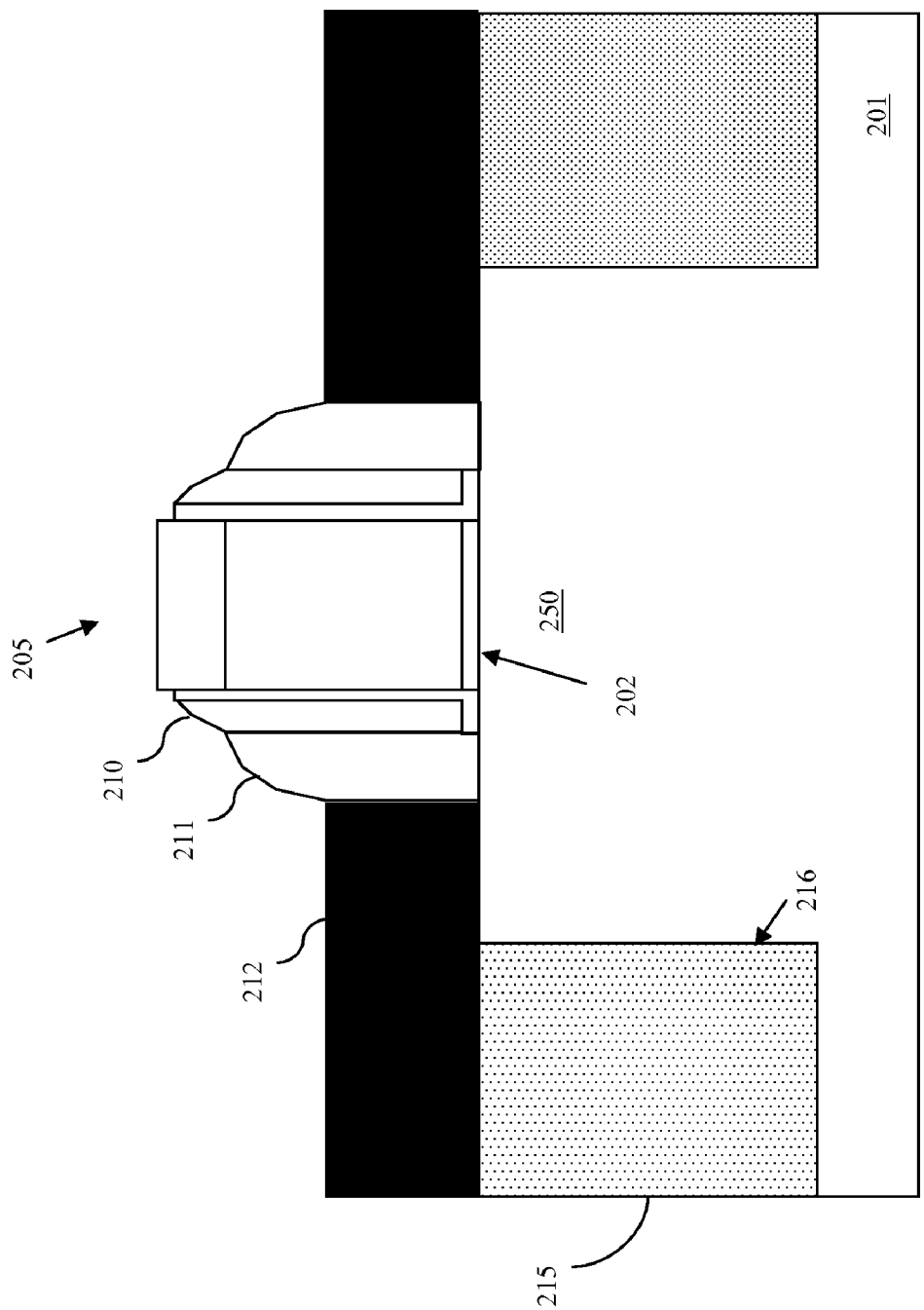
FIG. 10 is a cross-section diagram illustrating a partially-completed field effect transistor.
Figure 11:
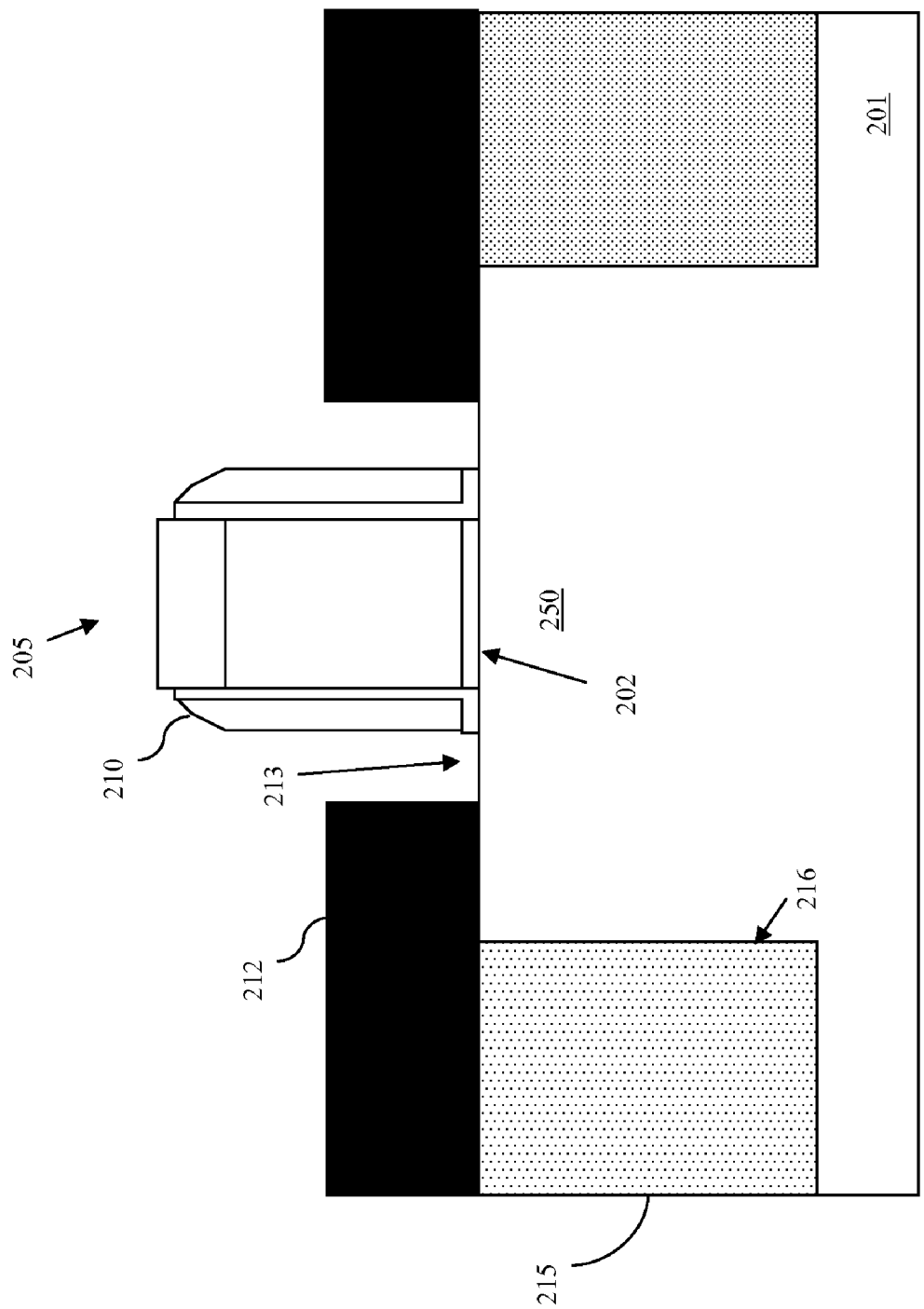
FIG. 11 is a cross-section diagram illustrating a partially-completed field effect transistor.
Figure 12:
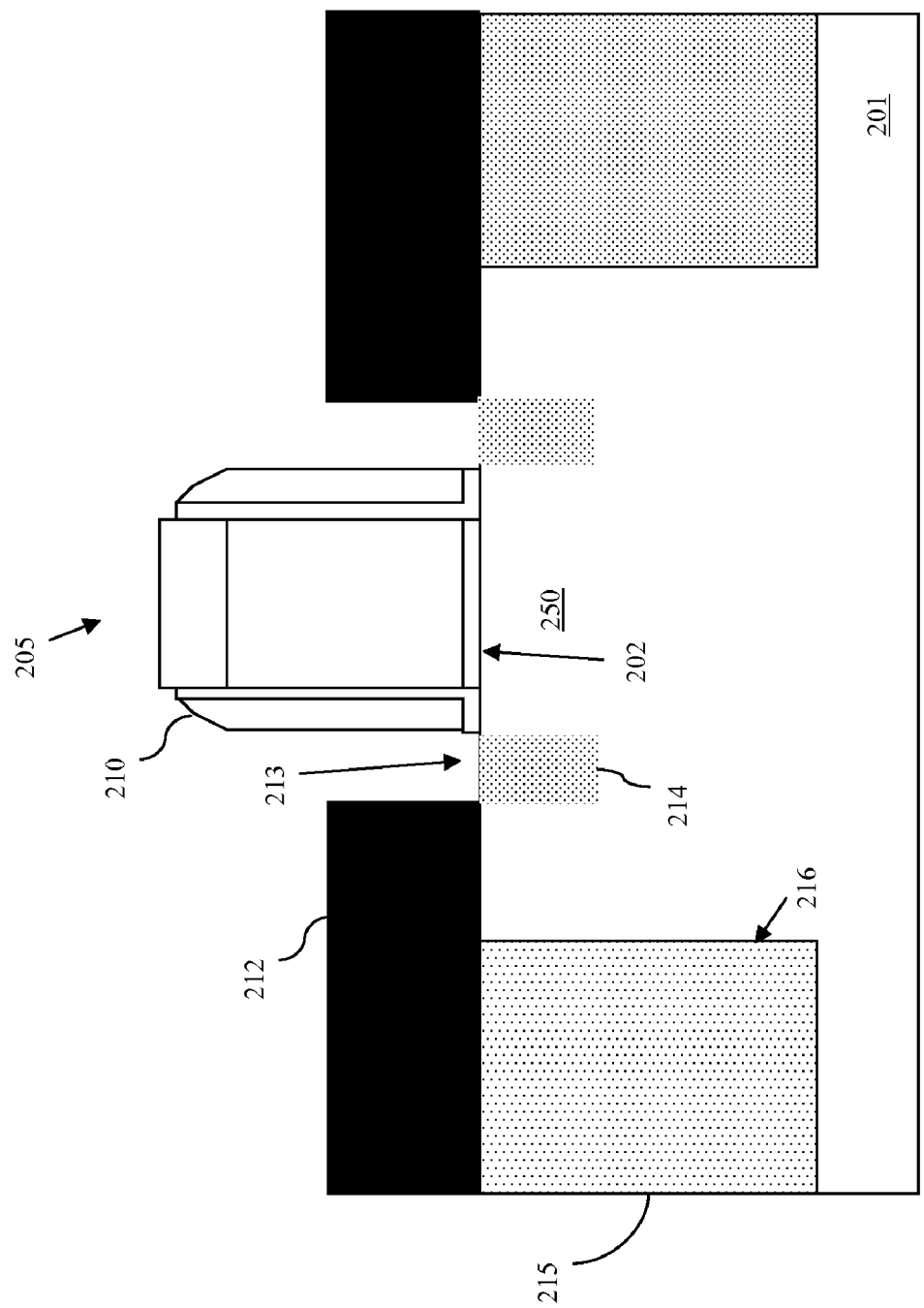
FIG. 12 is a cross-section diagram illustrating a partially-completed field effect transistor.

Consequently, in addition to the crystallographic etch, additional process steps, including an additional etch process, may be used during recess formation to tailor the first profile of the first side of each recess in order to enhance the desired stress imparted on the channel region (see steps 514-522). For example, before a crystallographic etch is performed, an ion implantation process (e.g., a self-aligned implant process) can be performed in order to form either doped or amorphized portions of the substrate immediately adjacent to the channel region (i.e., on opposite sides of the channel region) (514). Specifically, oxide sidewall spacers 211 can be formed adjacent to the nitride gate sidewall spacers 210 (see FIG. 9). Next, a mask layer 212 (e.g., a polymer layer, such as a photoresist layer) can be deposited (e.g., by a spin coating technique). The mask layer 212 is then recessed (e.g., by a reactive ion etch (RIE) process) such that the oxide sidewall spacers 211 are exposed, but the trench isolation regions 215 and substrate 201 remain protected (see FIG. 10). Once the mask layer 212 is in place, the oxide sidewall spacers 211 can be selectively removed in order to expose portions 213 of the substrate 201 between the mask layer 212 and gate sidewall spacers 210 (see FIG. 11). Next, an ion implantation process is performed in order to either dope or amorphize the exposed portions 213 of the substrate 201 (514, see FIG. 12). For example, heavy atoms, including but not limited to argon, silicon or germanium, can be used to form self-aligned amorphized portions 214 of the substrate 201 adjacent to the channel region 250. The amorphized/doped portion 214 of the substrate 201 can be selectively etched either before or after the crystallographic etch, depending upon the desired profile for the first side of the recess 220.

Figure 13:
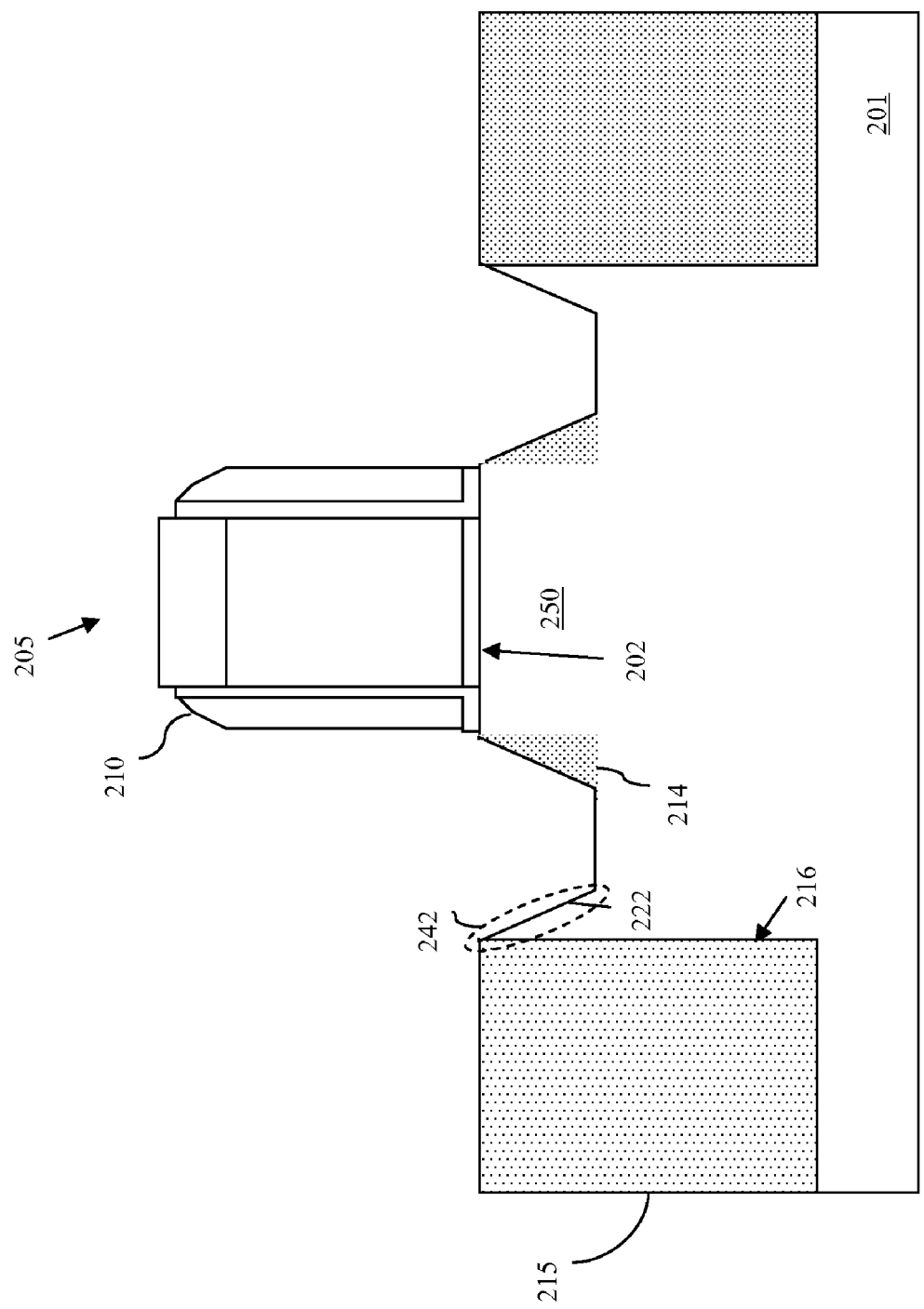
FIG. 13 is a cross-section diagram illustrating a partially-completed field effect transistor.
Figure 14:
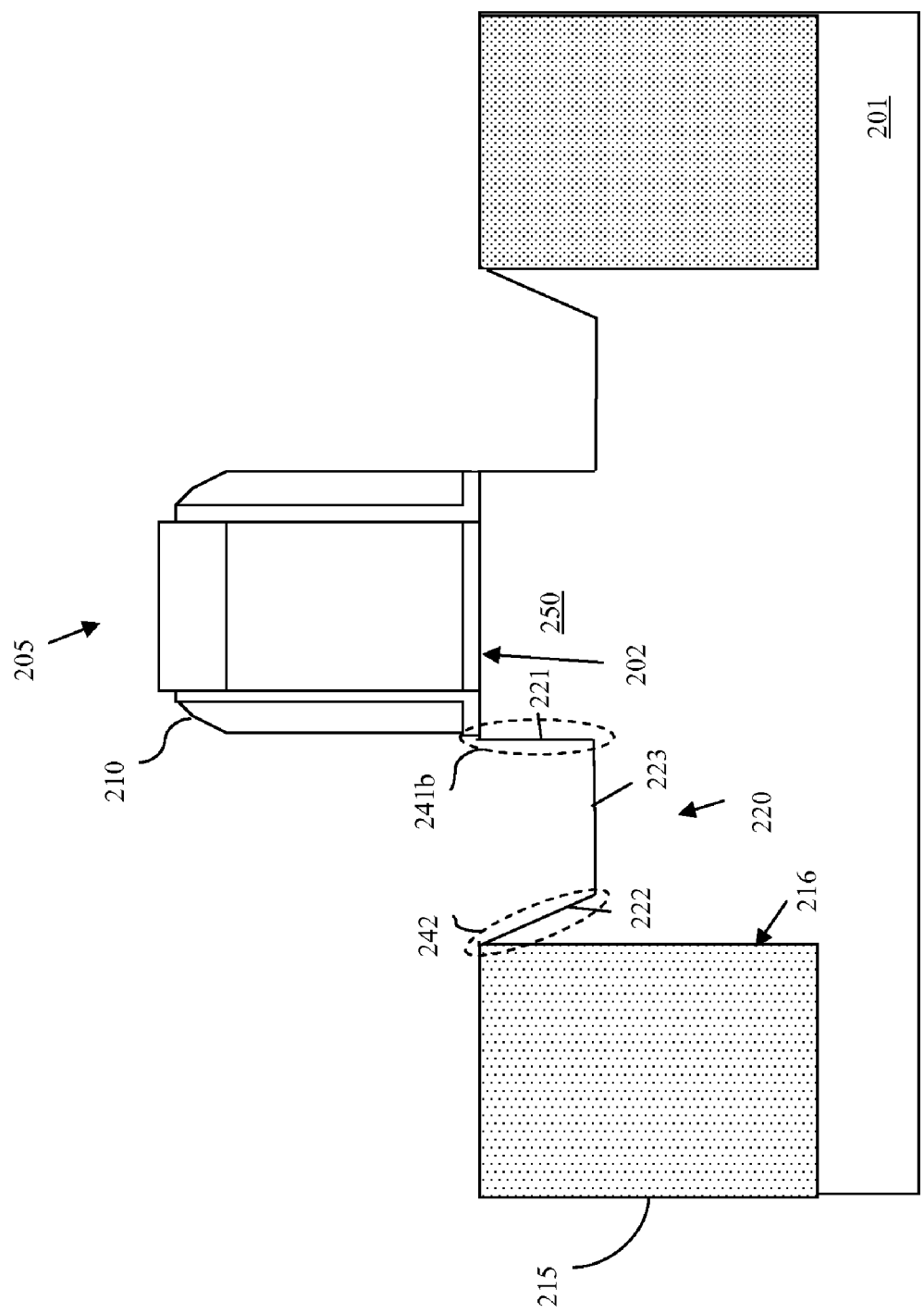
FIG. 14 is a cross-section diagram illustrating a partially-completed field effect transistor.

For example, following the ion implantation process, the mask layer 212 can be removed and a crystallographic etch process, as described in detail above, can be performed to ensure that the second side 222 of the recess will have an angled profile 242 (516, see FIG. 13). After the crystallographic etch, the doped/amorphized portions 214 of the substrate 201 can be selectively etched (i.e., etched selective to the substrate) to form the completed recesses 220 (518, FIG. 14). As illustrated in FIG. 14, performing the selective etch of the doped/amorphized portions 214 of the substrate 201 after the crystallographic etch, results in recesses 220 having a first side 221 that extends vertically from the upper edge of the recess 220 to the bottom surface 223 of the recess (i.e., such that the first profile 241b of the first side 221 of each recess 220 is approximately normal relative to the top surface 202 of the substrate 201).

Figure 15:
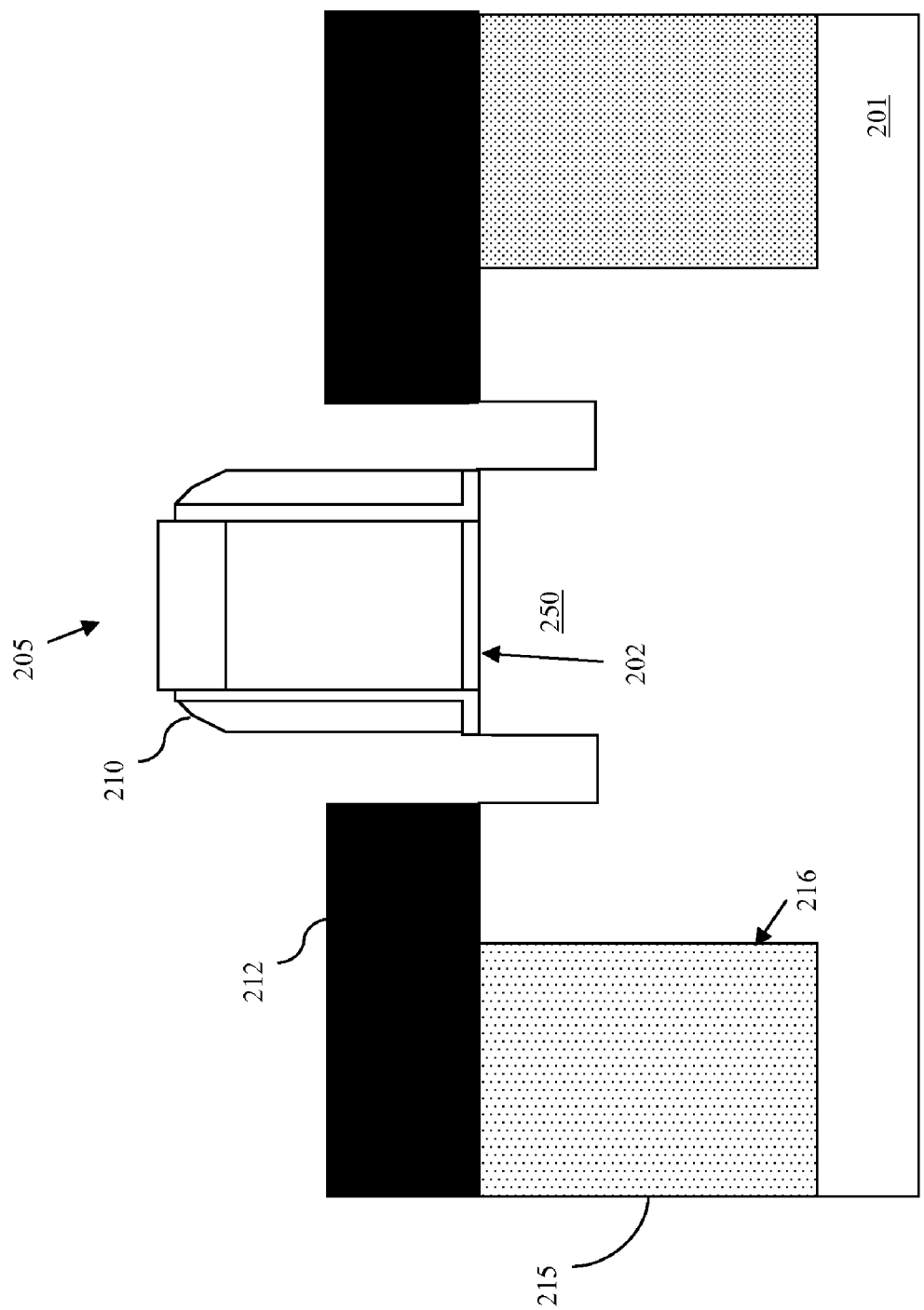
FIG. 15 is a cross-section diagram illustrating a partially-completed field effect transistor.
Figure 16:
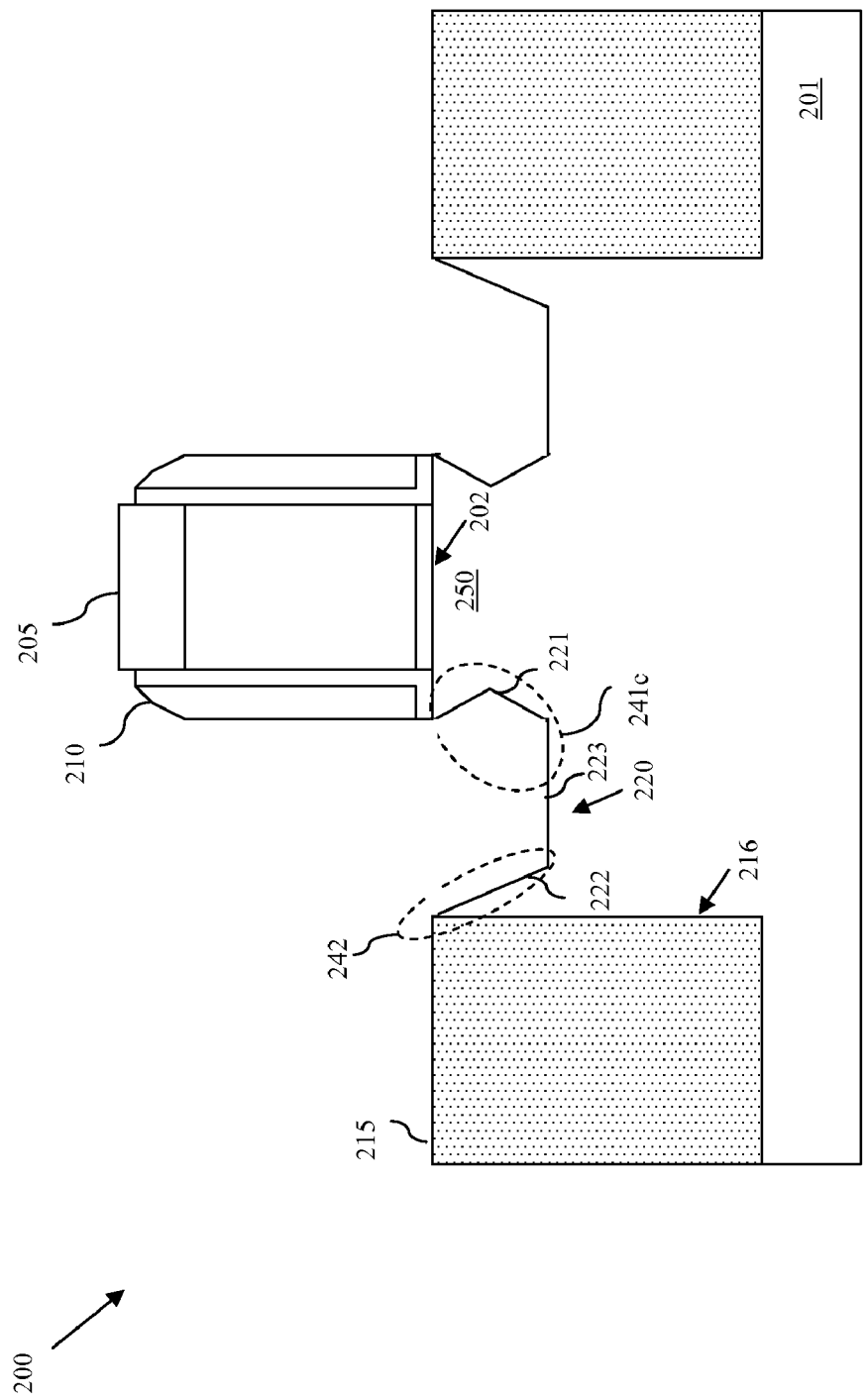
FIG. 16 is a cross-section diagram illustrating a partially-completed field effect transistor.

Alternatively, after the ion implantation process, but before the crystallographic etch, the doped/amorphized portions 214 of the substrate 201 can be selectively etched (i.e., etched selective to the substrate 201) (520, see FIG. 15). Next, the mask layer 212 is removed and the above-described crystallographic etch is performed to ensure that the second side 222 of the recess will have an angled profile 242 (522, see FIG. 16). As illustrated in FIG. 16, performing the selective etch of the doped/amorphized portions 214 of the substrate 201 before the crystallographic etch is performed, results in recesses 220 having a first side 221 with a first portion angled downward from the upper edge of the recess 220 towards the channel region 250 and a second portion angled upward from the bottom surface 223 of the recess towards the channel region 250 (i.e., the first profile 241c of the first side 221 of each recess 220 will be angled in a rotated V-shape toward the channel region 250).

After, the recesses are formed, they can be filled with a semiconductor film using conventional epitaxial deposition processes (508, see FIGS. 2-4). For example, if the transistor 200 being formed is a PFET, then silicon germanium can be deposited epitaxially into the recesses in order to impart a compressive stress on the channel region 250. It should be noted that doping the source/drain regions 260 with the appropriate n-type dopants (e.g., phosphorus (P), arsenic (As) or antimony (Sb) for an n-type field effect transistor (NFET)) or p-type dopants (e.g., boron (B) for a p-type field effect transistor (PFET)) can be performed in conjunction with this epitaxial deposition process. Since the recess 220 surfaces comprise exposed surfaces of the monocrystalline semiconductor substrate 201 (e.g., exposed silicon substrate) without any exposed surfaces of the trench isolation region 215, the epitaxial semiconductor film that is deposited will completely fill each recess 220. That is, the epitaxial semiconductor film deposition will not be faceted and, thus, no divots will be formed in the recesses along the sidewalls of the trench isolation regions.

Once the source/drain regions 260 are formed (at process 508), FET processing, including but not limited to, silicide formation, dielectric layer deposition, contact formation, etc. Since the resulting FET 200 structure is formed without faceted deposition of the source/drain film 230, it does not exhibit the junction leakage problems associated with prior art FET structures.

Therefore, disclosed above is a transistor that incorporates epitaxially deposited monocrystalline source/drain semiconductor films and a method for forming the transistor. A crystallographic etch is used to form recesses between a channel region and trench isolation regions in a silicon substrate. Each recess has a first side, having a first profile, adjacent to the channel region and a second side, having a second profile, adjacent to a trench isolation region. The crystallographic etch ensures that the second profile is angled so that all of the exposed recess surfaces comprise silicon. Thus, the recesses can be filled by epitaxial deposition without divot formation. Additional process steps can be used to ensure that the first side of the recess is formed with a different profile that enhances the desired stress in the channel region. In this way, the invention permits maximal channel strain with embedded silicon germanium without the problematic divot formation.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of embodiments, those skilled in the art will recognize that these embodiments can be practiced with modification within the spirit and scope of the appended claims.

What is claimed is:

1. A field effect transistor comprising:
    a substrate having a top surface;
    a channel region in said substrate at said top surface;
    a trench isolation region comprising:
        a trench extending into said substrate from said top surface, said trench comprising a sidewall essentially normal to said top surface; and
        an isolation material filling said trench; and
    a source/drain region positioned laterally between said channel region and said sidewall of said trench isolation region, said source/drain region comprising:
        a recess extending into said substrate from said top surface, said recess comprising:
            an upper edge at said top surface of said substrate;
            a bottom surface essentially parallel to said top surface of said substrate;
            a first side surface adjacent to said channel region and extending from said upper edge to said bottom surface, said first side surface having a first profile normal to said top surface of said substrate; and
            a second side surface opposite said first side surface and extending from said upper edge to said bottom surface, said second side surface having a second profile that is different from said first profile such that said first side surface and said second side surface are not symmetrical, said second profile comprising an angled profile relative to said top surface of said substrate and said sidewall of said trench isolation region such that only said upper edge of said recess at said top surface contacts said trench isolation region and said second side surface comprises only said substrate and not said isolation material; and
        a semiconductor film filling said recess.

2. The field effect transistor of claim 1, said semiconductor film comprising an epitaxial silicon germanium (eSiGe).

3. The field effect transistor of claim 1, said second side surface extending from said upper edge of said recess at said top surface of said substrate immediately adjacent to said trench isolation region downward and away from said sidewall of said trench isolation region such that a triangular portion of said substrate separates said semiconductor film in said recess from said isolation material in trench isolation region.

4. The field effect transistor of claim 1, said semiconductor film comprising a different semiconductor material than said substrate selected to apply a given strain on said channel region.

5. The field effect transistor of claim 1, said second side surface tapering at an angle of approximately 55° away from said upper edge towards said bottom surface.

6. A p-type field effect transistor comprising:
    a silicon substrate having a top surface;
    a gate on said top surface;
    a channel region in said substrate at said top surface aligned below said gate;
    a trench isolation region comprising:
        a trench extending into said substrate from said top surface and comprising a sidewall essentially normal to said top surface; and
        an isolation material filling said trench; and,
    a source/drain region positioned laterally between said channel region and said sidewall of said trench isolation region, said source/drain region comprising:
        a recess extending into said substrate from said top surface, said recess comprising:
            an upper edge at said top surface of said substrate;
            a bottom surface;
            a first side surface adjacent said channel region and extending from said upper edge to said bottom surface, said first side surface having a first profile normal to said top surface of said substrate; and
            a second side surface opposite said first side surface, said second side surface having a second profile that is different from said first profile such that said first side surface and said second side surface are not symmetrical, said second profile comprising an angled profile relative to said top surface of said substrate and said sidewall of said trench isolation region such that only said upper edge of said recess at said top surface contacts said trench isolation region and said second side surface comprises only said substrate and not said isolation material; and
        an epitaxial silicon germanium film completely filling said recess and imparting a compressive strain on said channel region to enhance hole mobility within said channel region.

7. The field effect transistor of claim 6, said second side surface extending from said upper edge of said recess at said top surface of said substrate immediately adjacent to said trench isolation region downward and away from said sidewall of said trench isolation region such that a triangular portion of said substrate separates said epitaxial silicon germanium film in said recess from said isolation material in said trench isolation region.

8. The field effect transistor of claim 6, said second side surface tapering at an angle of approximately 55° away from said upper edge towards said bottom surface.

* * * * *